United States Patent [19]
Schlicklin et al.

[11] Patent Number: 4,730,459
[45] Date of Patent: Mar. 15, 1988

[54] THERMOELECTRIC MODULES, USED IN THERMOELECTRIC APPARATUS AND IN THERMOELECTRIC DEVICES USING SUCH THERMOELECTRIC MODULES

[75] Inventors: Philippe Schlicklin, Nancy; John G. Stockholm, Vernouillet, both of France

[73] Assignee: Air Industrie, France

[21] Appl. No.: 768,691

[22] Filed: Aug. 23, 1985

[30] Foreign Application Priority Data

Sep. 12, 1984 [FR] France .................... 84 13990

[51] Int. Cl.⁴ .................... F25B 21/62; H01L 25/30; H01L 25/32
[52] U.S. Cl. .................... 62/3; 136/203; 136/204
[58] Field of Search .................... 62/3; 136/203, 204

[56] References Cited
U.S. PATENT DOCUMENTS

| 2,777,975 | 1/1957 | Aigrain | 136/203 |
| 2,944,404 | 7/1960 | Fritts | 62/3 |
| 3,127,287 | 3/1964 | Henderson et al. | 136/203 |
| 3,180,100 | 4/1965 | Newton | 136/204 |
| 3,213,630 | 10/1965 | Mole | 62/3 |
| 3,399,539 | 9/1968 | Herman | 62/3 |

FOREIGN PATENT DOCUMENTS

| 824347 | 11/1959 | United Kingdom | 136/203 |
| 1250868 | 10/1971 | United Kingdom | 136/204 |

Primary Examiner—Albert W. Davis, Jr.
Attorney, Agent, or Firm—Larson and Taylor

[57] ABSTRACT

A thermoelectric module comprises an odd number of thermoelements (1a, 2a, 1b) connected electrically in series and disposed thermally in parallel. The electrical current flowing through a heat exchanger (9) is conducted into the module by metallic members (8a, 8b) and by first and second types of connectors (4a, 4b and 6a, 6b).

21 Claims, 11 Drawing Figures

THERMOELECTRIC MODULES, USED IN THERMOELECTRIC APPARATUS AND IN THERMOELECTRIC DEVICES USING SUCH THERMOELECTRIC MODULES

FIELD OF THE INVENTION

The present invention relates to thermoelectric modules comprising a plurality of thermoelectric elements, and also to thermoelectric apparatus using such thermoelectric modules, either for heat pump applications or electricity generating applications.

BACKGROUND OF THE INVENTION

In heat pump applications, the thermoelectric effect is used to provide for transfer of thermal energy from a cold source to a warm source by means of electrical energy supplied to thermoelectric elements made with thermoelectric material. For electricity generating applications, the thermal energy transferred from a warm source to a cold source enables the production of electrical energy at the terminals of the thermoelectric elements.

In both cases, the thermoelectric elements, referred to hereinafter for shorthand purposes as thermoelements, associated with heat exchange apparatus can be assembled according to two embodiments or modes.

According to a first mode of assembly, a known type of thermoelectric module can be used, these modules being built with a plurality of thermoelements comprising an integral number of thermoelectric couples (one N-type thermoelement and one P-type thermoelement) assembled together into a construction wherein they are connected electrically in series and disposed thermally in parallel. FIG. 1 shows a schematic representation of the assembly of such thermoelements. As can be seen in this figure, there are only two thermoelements, i.e., one couple with one N-type thermoelement 1 and one P-type thermoelement 2, connected together in electrical relationship by electrical connectors soldered on the surfaces of the thermoelements. There are two types of electrical connectors, those connectors denoted 11, which connect the surfaces of two thermoelements (electrically) in series and further connectors, denoted 12, which act as inlet and outlet for the electrical current into the module. To assure the continuity of the electrical path provided, it is necessary to electrically insulate the electrical connectors connecting the thermoelements from the associated heat exchangers. Generally, such insulation is obtained using ceramic sheets 13 in very close good contact with the electrical connectors. These sheets produce a significant thermal resistance between the thermoelements and the heat exchangers, thereby lowering the thermal efficiency of the modules. Moreover, the ceramic sheets are brittle and must be assembled with care and, because of this brittleness, it is not possible to exceed weak contact pressures (less than 1 MPa), thus resulting in significant thermal contact resistance.

Further, the dielectric rigidity of the ceramic sheets is somewhat low and the operation of the modules under high voltage conditions is not possible, because the electrical discharges which result break down the insulation.

To overcome these disadvantages, a second mode of assembly of the thermoelements has been used in association with heat exchangers. According to this second embodiment or mode, the heat exchangers provide by themselves the electrical current conduction. Accordingly, the thermal resistances, normally produced by the insulation used, are eliminated. It is noted that this mode is known as "direct transfer" and reference is made, for example, to U.S. Pat. No. 3,213,630 (Cecil J. Mole).

The integration of thermoelements with heat exchangers means that the sizes must be adjusted accordingly, so that the cross sectional area of the thermoelements must be adequate to provide sufficiently thermal power for optimal utilization of the heat exchangers. A large cross sectional area dictates the use of a high amperage current through the thermoelements and as a result, the electrical voltage produced is weak. Indeed, in order to produce a given thermal power level in the case of heat pump applications, or to generate a given level of electrical power in the case of electricity generating applications, the number of large cross sectional area integrated thermoelements must be lower than the number of elements of smaller cross sectional area thermoelements composing the modules used in the first mode of assembly discussed above.

Indeed, because the pumped thermal power, or the generated electrical power, is proportional to the (sum of the) areas of the thermoelements, the sum of the thermoelement areas of a thermoelectric module is, for the same output, equivalent to the area of the directly integrated thermoelements.

In the case of heat pump applications, a direct current electrical supply must be used which produces large current levels with low voltage, thus dictating an electrical supply which is heavy and large in size. In the case of electrical power generation, the current produced at a low voltage and relatively large amperages is not well suited for most applications.

For example, a thermoelectric assembly comprising 480 thermoelements with an individual area of 1.5 cm$^2$ integrated to the heat exchangers, operates as a heat pump under fixed conditions with a voltage of 13 volts at a current of 200 amperes, while, in an electrical generating mode, for the same thermal conditions, the same assembly produces 30 amperes at 3.5 volts.

SUMMARY OF THE INVENTION

It is an object of the present invention to provide a thermoelectric module which combines the thermal efficiency and the good mechanical characteristics of integrated thermoelements with the provision of electrical current at a relatively high voltage and a relatively low amperage. The thermoelectric assemblies using these new modules are of the type where the heat exchangers provide for the transfer of the electrical current.

Generally speaking, a thermoelectric module according to the invention comprises an odd number of thermoelements connected electrically in series by current connectors, one face of the thermoelements being electrically insulated from electrically conducting members which are in thermal and electrical contact with heat exchangers which constitute the external portions of the module. Electrical current flowing through the heat exchangers is conducted into the module by the electrical conducting members, each of which is in electrical contact with a corresponding connector, that is, in turn, connected to an input or output face for current flow to or from the input or output thermoelements connected in the current path.

BRIEF DESCRIPTION OF THE DRAWINGS

Other characteristics and advantages of the invention will appear in the following description, which makes reference to the accompanying drawings in which.

DESCRIPTION OF THE PREFERRED EMBODIMENTS

Referring to the schematic representation shown in FIG. 2, a thermoelectric module according to the invention comprises an odd number of thermoelements, alternatively of the N-type (denoted $1a$ and $1b$) and the P-type (denoted $2a$) secured by means of a suitable connecting material such as solder, as indicated at 3, to electrical connectors, described below, which are designed to connect these thermoelements in series. These connectors can being either in good electrical and thermal contact with further electrically conducting members $8a$, $8b$, which themselves are in contact with a pair of heat exchangers denoted 9, or electrically insulated from but in good thermal contact with the members $8a$, $8b$.

Considering these connectors, a first type of connector, indicated at $4a$, $4b$, provides the electrical connection between the members $8a$, $8b$ in contact with the heat exchangers 9, and the inlet (input) or outlet (output) faces of thermoelements $1a$ and $1b$ consistituting the input and the output terminals for current flow into the module. Therefore, they are two connectors $4a$, $4b$ for the module, each being secured to one of the members $8a$, $8b$ by soldering, as indicated at 5, so that the inlet or input for the current is provided by one of the members $8a$, $8b$ and the outlet or output by the opposite member $8b$, $8a$.

A second type of connector $6a$, $6b$ provides the electrical connection between the thermoelements $1a$, $1b$ and $2b$ two by two, i.e., in pairs. The electrical current is not able to pass through the member $8a$, $8b$, because an electrical insulating layer 7 is placed on the surfaces of the connectors $6a$, $6b$ facing of these members $8a$, $8b$. To provide good thermal contact and a good mechanical connection between connectors $6a$, $6b$ and members $8a$, $8b$, a further layer 10 is utilized. Layer 10 can have the same composition as the insulating layer 7, if the latter is an electrically insulating compound able to function as an adhesive for the facing surfaces of members $6a$, $6b$, $8a$ and $8b$. Alternately, layer 10 can be a sheet of another compound like a solder, which then requires a surface treatment for the external face of insulating layer 7 to enable adherence of solder on that face.

Figure 1:
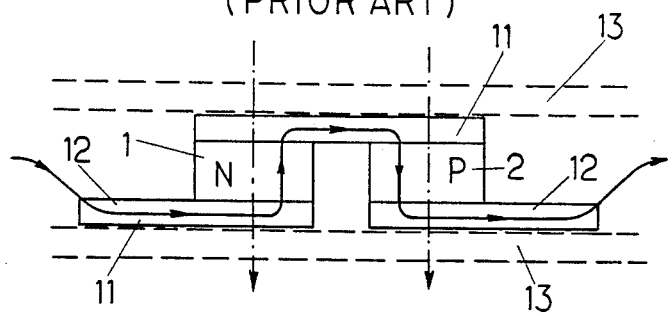
FIG. 1 a schematic representation of a thermoelement assembly as used in known thermoelectric modules.
Figure 2:
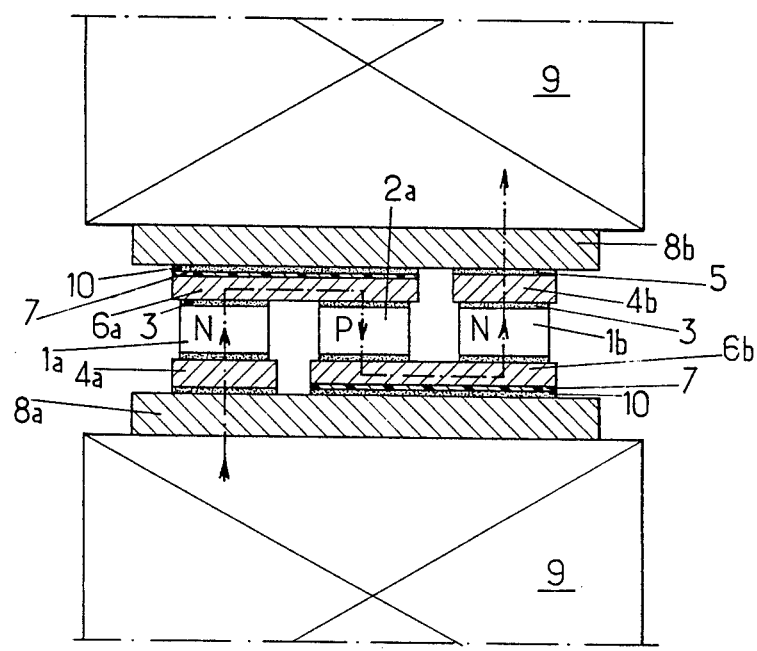
FIG. 2 is a side elevational cross sectional view showing a thermoelectric module according to the invention, as placed between two heat exchangers.

The assembly represented in FIG. 2, which is shown as comprising only three thermoelements in order to simplify the drawing, uses a module according to the invention with two N-type thermoelements $1a$, $1b$ and only one P-type thermoelement $2a$. That module is functionally equivalent to a specific module which could utilize a single N-type thermoelement, the cross sectional area of which could be equal to the sum of the cross sectional areas of the three thermoelements of the module, to the extent that the performances of the two types of materials can be considered to be equivalent. But such a single thermoelement could require a current threefold in amperage and one third in voltage as compared with the module according to the invention.

In the instance where the two types of materials are equivalent, the same cross sectional area can be used for both the N- and P-types of elements. Practically speaking, the above solution is the most simple, but does not depart from the scope of the present invention by providing that each of both the N- and P-type elements have an adapted cross sectional area to optimize the couple N+P, for example, for providing the nominal current of the assembly.

Therefore both N and P-types modules can be used according to the invention to provide thermoelectric assemblies, in the same way as single modules, with the advantage that the electrical current amperage will be divided and the voltage multiplied by the factor $(2x+1)$, i.e., corresponding to the number of thermoelements used in the manufacture of modules.

Briefly, a thermoelectric module according to the invention comprises:

$(2x+1)$ thermoelements divided into:

$(x+1)$ thermoelements of a first type N or P, and x thermoelements of a second type P or N 2x electrical connectors $6a$, $6b$, electrically insulated by the layer 7, 10 from the members $8a$, $8b$ for connecting two by two the thermoelements inside of the module.

2 electrical connectors $4a$, $4b$ in good electrical contact with the members $8a$, $8b$ and acting the inlet and the outlet for the electrical current for the module (the two inlet and outlet thermoelements which are secured to a connector $4a$ or $4b$ being necessariliy of the same type as the $(x+1)$ thermoelements).

2 members 8a, 8b electrically and thermally connected in good electrical and thermal contact at their inner face, each with a connector 4a or 4b and only in good thermal contact with x connectors 6a, 6b, which are electrically insulated by the layer 7 and secured by the layer 10 of the members.

As shown in FIG. 2, to build a module according to the invention, connections or linkings are first provided between the members 8a, 8b and the electrical connectors 4a, 4b and 6a, 6b. The connectors 4a, 4b are soldered on the members 8a, 8b by solder 5 and the connectors 6a, 6b are secured to the members 8a, 8b by the layer 10 which adheres to both the corresponding members 8a, 8b and to the insulating layer 7 placed on the surfaces of connectors 6a, 6b facing the corresponding members 8a, 8b. A suitable compound can at the same time assume both of the functions of the two layers 7 and 10, which are functionally separate, i.e., differ in function.

The members 8a, 8b supporting the electrical connectors 4a, 5b and 6a, 6b are subsequently provided with a diffusion barrier, for instance a nickel layer, to avoid pollution of the thermoelements by diffusion of compounds of the electrical connectors, for instance copper, into the solder 3 during the process wherein the thermoelements are soldered on the connectors. The latter is the last step assembly the module according to the invention before shaping of the two surfaces for external contacts.

In that case, the melting point of solder 3 used to secure the thermoelements to the connectors must be lower than that of the solder 5 and ultimately of the solder 10, to avoid desoldering of the assembly.

In another method of manufacture of a module according to the invention, the soldering of thermoelements can be done first, using the solder 3, on the connectors 4a, 4b and 6a, 6b, the latter having already been provided with a diffusion barrier, if required and for the connectors 6a, 6b, the insulating layer 7 (where the latter is separate from the securing layer 10). The operation may be carried out in a suitable assemblying device, with the assembled core of the module according to the invention being secured between the two members 8a, 8b using solder connection 5 for the connector 4a, 4b and the adhesive layer 10 for the connectors 6a, 6b, the latter layer 10 being either a solder identical to solder 5 or an adhesive identical to the insulating layer 7. For this method, the melting point of the solder 5 and of layer 10 must be lower than that of the solder 3, which is used secure the thermoelements to the connectors, in order to avoid a desoldering of the connections made previously.

It is pointed out that the insulating layer 7, interposed between the connectors 6a, 6b and the members 8a, 8b, may have relatively weak dielectric strength, since the voltage drop to which layer 7 will be subjected is at the most several volts, corresponding to the operating voltage of the module. A small insulation fault between a connector 6a, 6b and the corresponding member 8a, 8b will produce a very small current, the thermal effect of which on the thermal operation of the module may be regarded as negligible.

The thermoelectric modules according to the invention are able to simply employ the single thermoelements used for the implementation of the assembly with integrated thermoelements. The modules according to the invention thus have similar shapes and comparable sizes with those of the elements employed.

Figure 3:
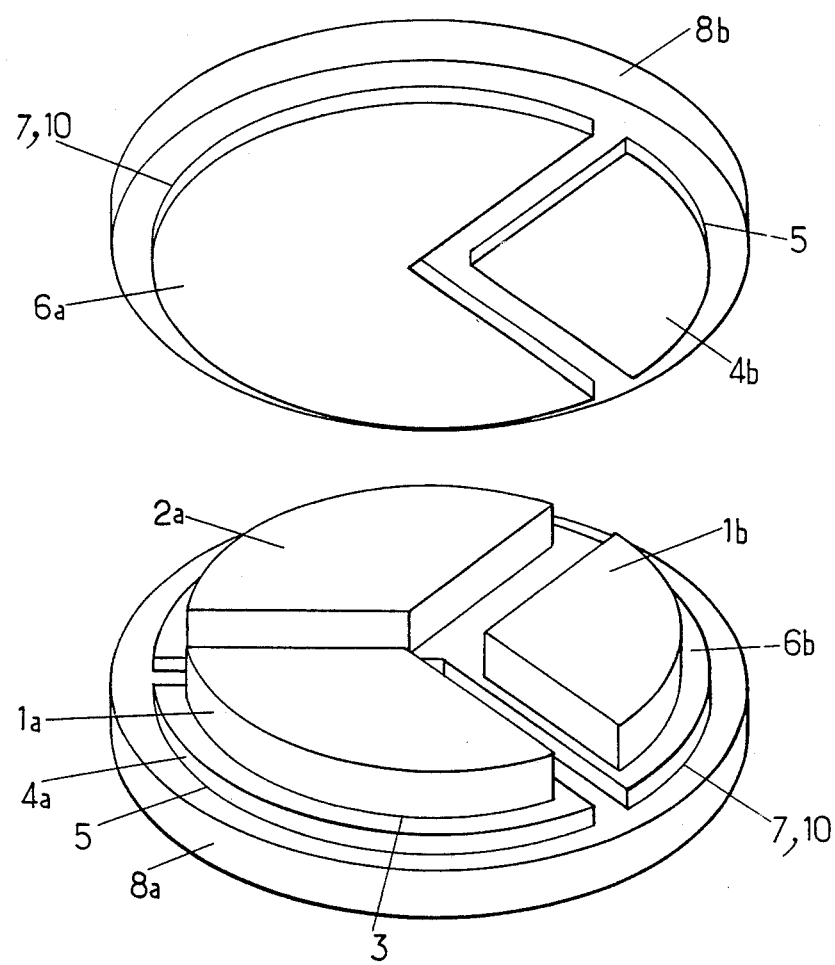
FIG. 3 is a schematic perspective view of a thermoelectric module according to the invention, comprising three thermoelements, the shapes of which are a sector of disc, and with the upper part of module being shown as separated for reasons of clarity.

The members 8a and 8b, which are in thermal and electrical contact with the heat exchangers by means of their faces which are not visible on FIG. 3, are made using good thermally and electrically conducting metals, for instance copper or aluminum, after a surface treatment to reduce the electrical and thermal surface resistance thereof and to allow the possible soldering of the two connectors 4a, 4b.

In such a configuration, each member 8a, 8b supports or carries one connector 4a, 4b fixed to corresponding member 8a, 8b by the solder 5, and one connector 6a, 6b, electrically insulated by the layer 7 and fixed to corresponding member 8a, 8b by the layer 10. Both types of connectors have the shape of sectors of a disc (i.e., are pie shaped) covering approximately one third of circumference for the connector 4a, 4b and two thirds of circumference for the connector 6a, 6b, and are secured onto members 8a, 8b in a non-contiguous position to avoid mutual electrical contact.

The thermoelectric elements 1a, 1b and 2a have the shape of sectors of a disc (approximately a third of a disc) and are obtained, for example by suitable slices in circular section thermoelectric material ingots. These elements are fixed to connectors 4a, 4b and 6a, 6b by a solder connection 3, the connectors being preferably provided, on the surfaces thereof contacting the thermoelements, with a diffusion barrier for preventing pollution of thermoelectric materials by the metal of the connectors 4a, 4b and 6a, 6b. The diffusion barrier is typically a layer of nickel.

The electrical connections of the upper part of a module are identical to those of the lower part but are rotated with respect thereto so as to allow for an offset of 120° for the connectors 4a, 4b acting as the inlet and outlet for the module current. In FIG. 3, the current inlet and outlet are provided by an N-type thermoelement 1a and 1b, and the module according to the invention is functionally equivalent to a single N-type thermoelement.

Figure 4:
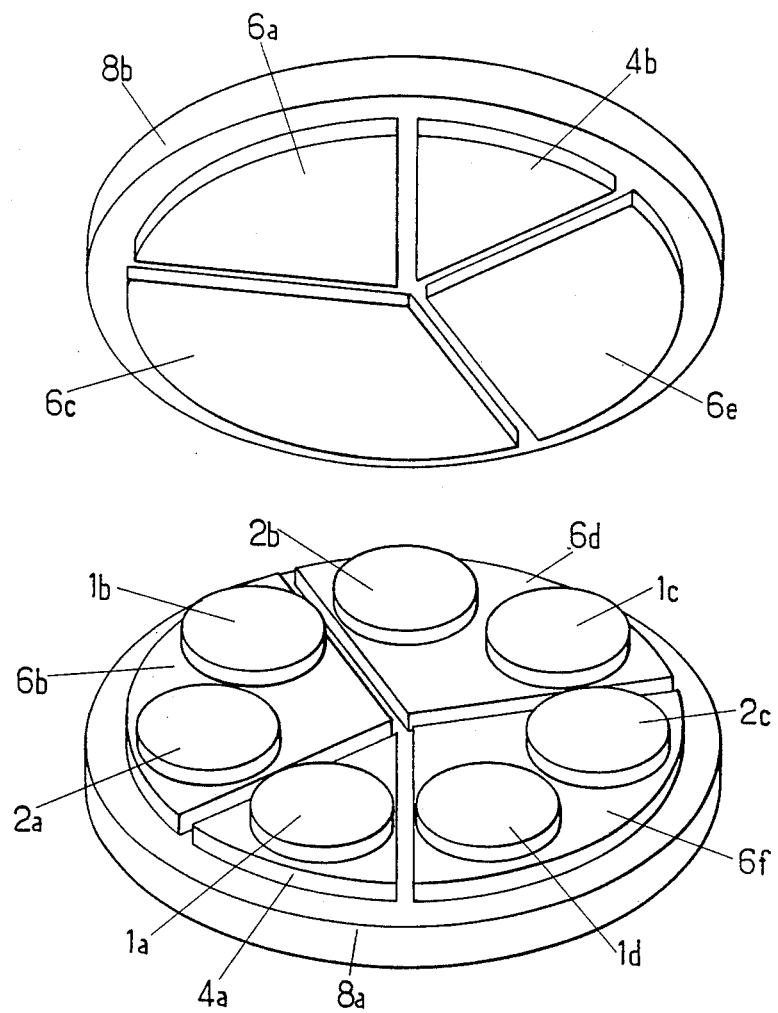
FIG. 4 is a schematic perspective view of a thermoelectric module according to the invention, which is similar to FIG. 3, but comprising seven thermoelements with circular shapes.

FIG. 4, which is similar to FIG. 3, shows another embodiment of a module according to the invention; as in FIG. 3, the module is circular shaped, but the module of FIG. 4 includes seven thermoelements of circular section.

In FIG. 4, if electrical current enters through the lower member 8a, this current will pass successively through: connector 4a, N-type thermoelement 1a, conector 6a on the upper member 8b, P-type thermoelement 2a, connector 6b on the lower member 8a, N-type thermoelement 1b, connector 6c, P-type thermoelement 2b, connector 6d, N-type thermoelement 1c, connector 6e, P-type thermoelement 2c, connector 6f, N-type thermoelement 1d, connector 4b, and will exit by the upper member 8b.

In this embodiment, as in the embodiment of FIG. 3, the current inlet and outlet are provided by an N-type thermoelement and (consequently) the module according to the invention is functionally equivalent to a single N-type thermoelement.

Figure 5:
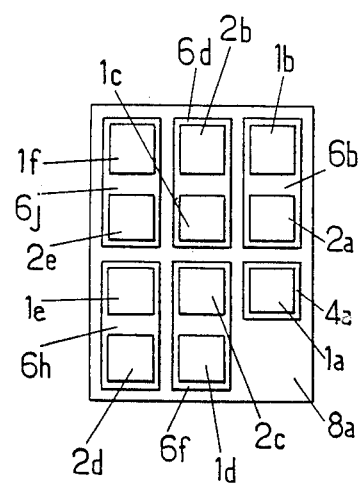
FIG. 5 is a bottom plan view of another embodiment of a thermoelectric module according to the invention which is of rectangular shape and comprises eleven square section thermoelements, showing the pattern of the lower side electrical connectors.
Figure 6:
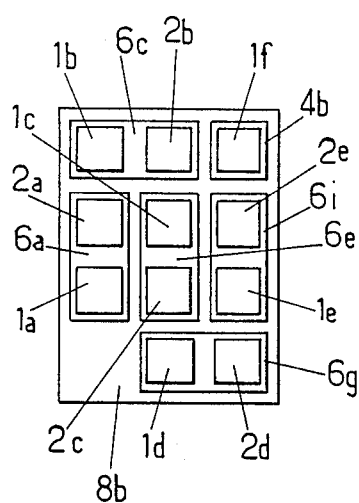
FIG. 6 is a top plan view of the right hand portion of the upper side of module of FIG. 5, showing the upper side electrical connectors.

Another embodiment of a module according to the invention is shown in FIGS. 5 and 6. The module is rectangularly shaped and comprises eleven thermoelements distributed in three rows one of which is incomplete.

FIG. 5 is a bottom plan view of the lower part of the module showing the electrical connections.

The current inlet is provided by the rectangular shaped member 8a, which in good thermal and electrical contact with a heat exchanger acting also as electrical conductor as in the previous embodiments. The current enters into the series of eleven thermoelement 1a, 2a, 1b, 2b, 1c, 2c, 1d, 2d, 1e, 2e and 1f through the connector 4a which is in good electrical contact with the member 8a, the connectors 6b, 6d, 6f, 6h, 6j being electrically insulated, but being in good thermal contact with the sheet 3a.

In FIG. 6, wherein the same reference numbers indicate the same parts, a top plan view of the upper part of the module of FIG. 5 is shown, with the module being turned over from the right, FIG. 6, showing, as in FIG. 5, the electrical connectors, and the pattern of the thermoelements.

The current flows between the members 8a and 8n, one after another, through the following components of the module: connector 4a, thermoelement 1a, connector 6a, thermoelement 2a, connector 6b, thermoelement 1b, connector 6c, thermoelement 2b, connector 6d, thermoelement 1c, connector 6e, thermoelement 2c, connector 6f, thermoelement 1d, connector 6g, thermoelement 2d, connector 6h, thermoelement 1e, connector 6i, thermoelement 2e, connector 6j, thermoelement 1f and connector 4b.

As in the two preceding examples, because the current inlet and outlet are formed by two N-type thermoelements, the module comprising eleven thermoelements is functionally equivalent to a single N-type thermoelement.

Such an arrangement is geometrically comparable with that used in implementing known thermoelectrical modules, but in the present invention, two electrical conducting sheets 8a, 8b take the place of insulating sheet of the conventional assembly, and the number of thermoelements is odd, while this number is even in known modules.

It will be understood that without departing from the broad scope and spirit of the invention, rectangular modules can be complemented with single row shaped, square shaped or regular or non polygonal shaped elements.

In one embodiment, one can produce, for example, by machining or stamping, a single member joining the member 8a or 8b to the associated connector 4a or 4b.

Utilization of modules according to the invention is made through the provision of compact thermoelectric assemblies, the basic unit of which is a "stack" constituted by an active element, i.e., the module according to the invention, disposed between a cold heat exchanger (where the fluid to be cooled flows) and a warm heat exchanger (where the fluid to be warmed flows). Such a stack is shown in FIG. 7 which represents an assembly comprising three heat exchangers 9a, 9b, 9c and two modules according to the invention, which as similar to, in order to simplify the drawings, the module shown in FIG. 2, and the same reference numbers have been used in indicating similar parts in FIGS. 7 and 2.

Figure 7:
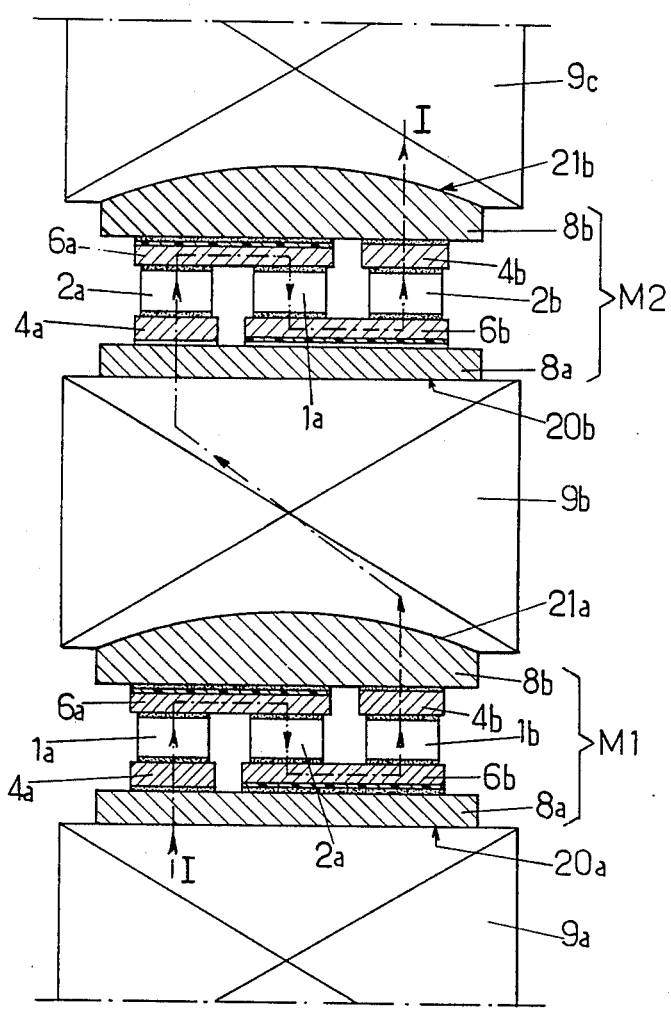
FIGS. 7 and 8 are side elevation views of two arrangements of heat exchangers with thermoelectric modules according to the invention, these modules being similar to that of FIG. 2.
Figure 8:
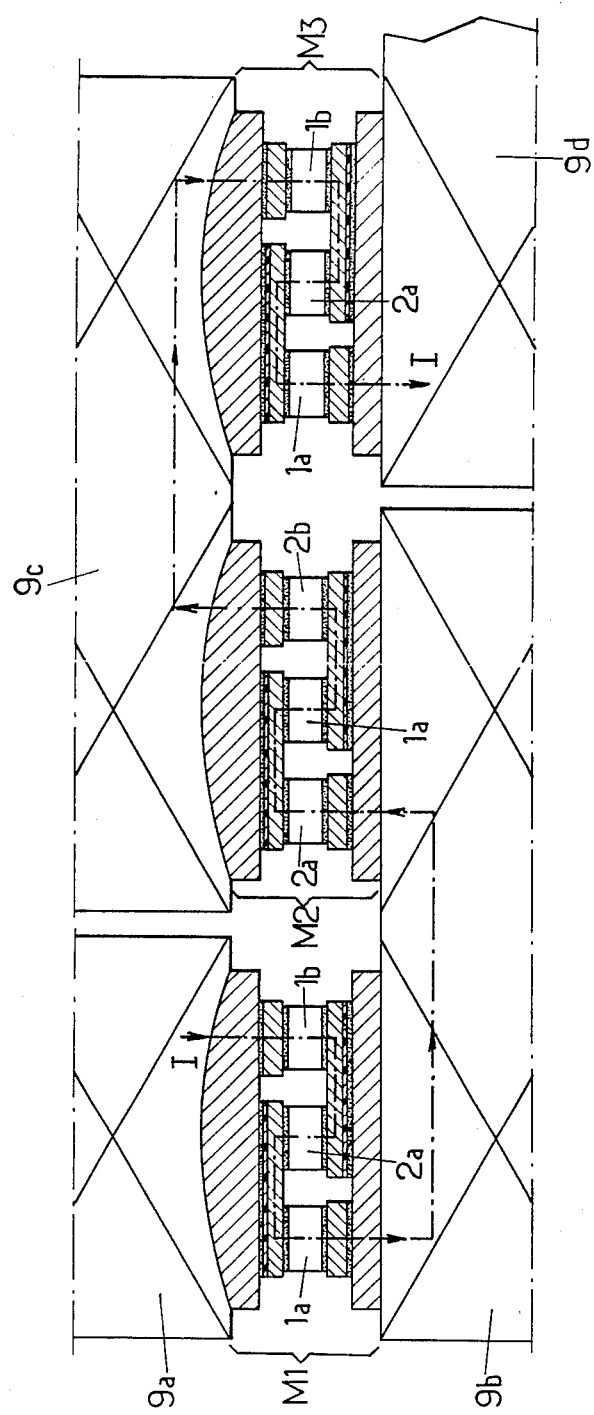

A modification of such a stack is also shown in FIG. 8 wherein the same reference numbers indicate the same parts as in FIG. 7. In this embodiment, only the relative arrangement of diverse parts differs from that shown in FIG. 7, and thus the following description of FIG. 7 also generally applies to FIG. 8.

FIG. 7 shows two modules constructed according to the invention, the first, M1, being equivalent to an N-type thermoelement, the second, M2, to a P-type thermoelement and with the two cooperating with the heat exchangers 9a, 9b, 9c to form a column or stack, the electrical current passing therethrough upwardly.

The module M1 is in good thermal and electrical contact with the heat exchangers 9a and 9b through the surfaces 20a and 21a which are respectively the external faces of members 8a and 8b of the module M1. Likewise, the module M2 is in good thermal and electrical contact with the heat exchangers 9b and 9c, through the surfaces 20b and 21b which are the external faces of members 8a and 8b of module M2, respectively.

FIG. 8 shows three modules according to the invention, denoted M1, M2, M3 and cooperating with four heat exchangers 9a, 9b, 9c, 9d to constitute an arrangement wherein path for the electrical current is like a Greek key pattern.

It can be seen in FIG. 7 that each module according to the invention cooperates with the (two) corresponding heat exchangers through a planar surface (20a or 20b) on one side and on other side through a non-planar surface (21a or 21b) which is here assumed to be a portion of convex spherical surface. The same feature is provided in the embodiment of FIG. 8.

The disposition or arrangement is dictated by following considerations:

Because the thermoelectric material has good mechanical strength only under compression, it is advantageous to place the stack under compression. Moreover, this approach allows thermoelectric assemblies to be built which comprise a large number of active elements, by juxtaposition of non-soldered members, the active elements being in contact with the heat exchangers through suitable interfaces. Once the system is assembled, one can then solder the whole or a part of the interfaces, with the condition that one layer or one sheet of solder be (previously) placed thereon and the melting point of the solder be low enough to enable soldering to be affected without such a rise in temperature of the whole assembly that would cause damage. Moreover, in many cases, one can utilize non-soldered contacts, because the assembly, when under compression, provides high pressures (10 MPa or more) at the interfaces, and this results in very low thermal and electrical resistances at these interfaces. Further, a paste with good thermal and electrical conductivity can be provided at these interfaces.

The geometry of interfaces is dictated not only be thermal and electrical considerations, but also by mechanical requirements. The very weak tensile and shear strengths of thermoelectric materials practically require a fitting or mounting for thermoelectric assemblies which maintains the thermoelectric material under compression, because their mechanical strength is great, as stated, only in compression mode.

The pressure must be uniformly applied onto the thermoelements constituting a module according to the invention, in order to prevent generation of any component of shear or torsional stress which would bring about destruction of thermoelements or of their connections.

Between the members 8a, 8b and the heat exchangers 9a, 9b, 9c, a planar contact for each interface of the module presents hazards due to lack of parallelism of the two faces of module. The resulting compressional forces concentrated at one point of the module can place under traction, and damage, another point of the module. This hazard prohibits for conventional thermoelectric modules, which always have two planar interfaces, the securing together of the modules necessary to provide good thermal contact.

It is advantageous that at least one of the two contacts of module have a special geometry, so as to accomodate differences in parallelism of all of the members of the above-mentioned assembly (heat exchangers and active members) and the transmission of only the compression forces onto the thermoelements. Such results are obtained by using, for at least one of the contact faces, a spherical or cylindrical surface.

A spherical surface is especially well suited for the case of circular shaped modules.

Figure 9:
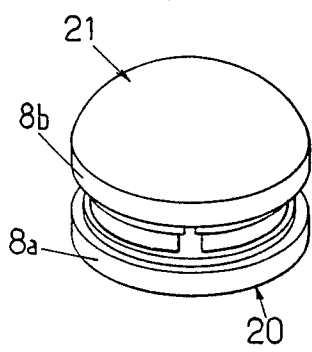
FIG. 9 is a perspective view of a module according to the invention, wherein one of the external faces thereof, viz., that in contact with a heat exchanger, is of a convex spherical surface, the other face being planar.

FIG. 9 shows a module according to the invention with a circular shape, one contact surface 20 of which, forming the external face of member 8a, is planar and the second surface 21, forming the external face of member 8b, is a portion of a convex cylindrical.

Of course, many different combinations are possible including two convex or concave spherical surfaces, a concave spherical surface and a convex spherical surface, a planar surface and a concave spherical surface, and other arrangements which are not illustrated here to avoid multiplication of the number of drawings.

The single or the two spherical surfaces cooperate with reciprocally shaped surfaces provided for the heat exchangers. The latter are provided with either a dished or recessed spherical surface if the modules have convex spherical surfaces, or a projecting portion of a sphere if the module have concave spherical surfaces. In any event, the radius of the corresponding surface must be slightly greater than that of the reciprocally shaped convex surface to allow proper positioning at the time of the units are stacked.

Further, contacts can be used with the form of parts of cylindrical surfaces. Such a shape or form is more particularly, but not exclusively, suited for the rectangular or square shaped modules according to the invention.

Figure 10:
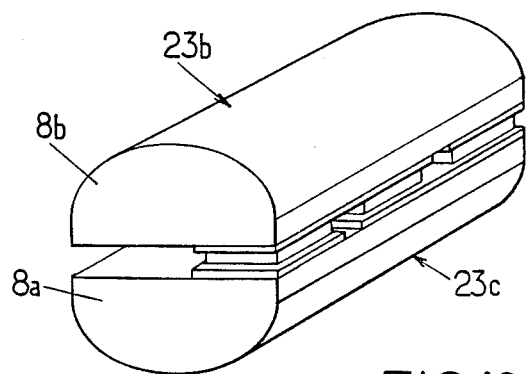
FIG. 10 is a perspective view of a thermoelectric module according to the invention, wherein both faces which contact the heat exchangers are convex cylindrical surfaces with parallel axes.
Figure 11:
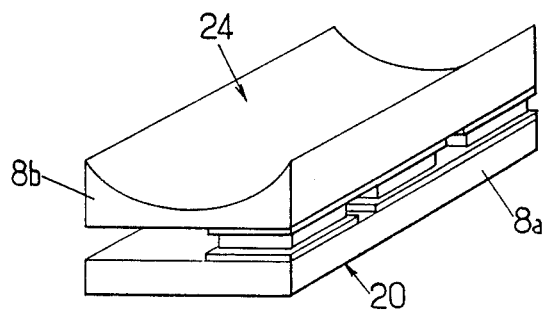
FIG. 11 is a perspective view of a module according to the invention, wheren one of the faces, viz., that in contact with the heat exchanger, is a concave cylindrical surface, and the other is planar.

FIG. 10 shows a module according to the invention wherein the surfaces 23a and 23b (and corresponding to members 8a and 8b respectively) in contact with the heat exchangers are convex cylindrical surfaces with parallel axes. FIG. 11 shows a module according to the invention with a concave cylindrical contact surface 24 (corresponding to member 8b), the second surface 20 (corresponding to member 8a) being planar.

It will be understood that other arrangements not shown in the drawings can be used without departing from the scope and spirit of the invention.

Some examples are:
  a planar contact and a convex or concave cylindrical contact:
  two concave cylindrical contacts with parallel axes;
  two convex or concave cylindrical contacts with orthogonal axes, located in parallel planes; and
  a spherical contact and a cylindrical contact with the overall arrangement of concave or convex shapes.

The single or the two cylindrical surfaces must cooperate with reciprocally shaped cylindrical surfaces of the heat exchangers. These surfaces can be cylindrical grooves or recesses if the modules have convex cylindrical surfaces or projecting cylindrical surfaces if the cylindrical surfaces of the module are concave.

As for the assemblies of spherical surfaces, the radius of the female part will be advantageously slightly greater than that of the male part.

As will be understood, and moreover, is evident from the foregoing, the invention is not limited to the specific embodiments described above. The invention covers on the contrary a wide range of modifications, including those wherein the cross sectional areas provided for current flow are optimized for each of the two N and P-types of thermoelements and also for the particular operating conditions, such optimization being carried out according to the thermoelectric characteristics of both the N and P-type elements, including the special case wherein the cross sectional areas for both types of thermoelements are equal, corresponding to equal or near thermoelectric characteristics of the thermoelements.

What is claimed:

1. A thermoelectric module comprising a plurality of thermoelements, associated electrical connectors and cooperating heat exchangers adapted to form thermoelectric devices made of stacks of active thermoelectric units formed by a plurality of said modules and each associated with a heat exchanger through which flows a fluid to be cooled or a fluid acting as a cold source, and with a heat exchanger through which flows a fluid to be warmed or a fluid acting as a warm source, wherein said thermoelectric module includes an odd number $(2x+1)$ of thermoelements, wherein (x) is a positive, non-zero integer; said thermoelements being connected electrically in series and thermally in parallel and being secured to corresponding electrical connectors, said electrical connectors being secured to inner face of two electrically conducting members which are in electrical and thermal contact, through the external faces thereof, with the heat exchangers and which act also as electrical terminals for module current flow, said electrical connectors which are secured to thermoelements being either two connectors of a first type secured, respectively, to a face of an inlet thermoelement and a face of an outlet thermoelement and in thermal and electrial contact with a respective one of said electrically conducting members so as to provide a module current inlet and outlet, or connectors of a second type, which are 2x in number, and are respectively secured in two groups of x connectors to the inner faces of said members in thermal contact therewith but electrically insulate therefrom by at least one insulating layer disposed on the surfaces of the second type connectors facing the inner faces of said members, said second type connectors serving to connect two by two the faces of the thermal elements which do not provide the current inlet and outlet so as to provide, in combination with the thermoelements which provide the current inlet and outlet and are secured to the two first type connectors, a preferential path for the current wherein the current is forced to flow through the entire plurality of thermoelements between the current inlet and outlet without flowing through said members, said module including $(x+1)$ thermoelements of a P or N-type and x thermoelements of the other P or N-type, and the current inlet and outlet being provided by two thermoelements of the type of the said $x+1$ thermoelements, so as to provide one or the other of two kinds of modules which are functionally equivalent to single N and P-type thermoelements, at least one of the two external faces of said electrially conductive members in thermal and electrical contact with the heat exchangers having a non-planar shape cooperating with a reciprocally shaped base member of the corresponding heat exchanger.

2. A module according to claim 1, wherein two external faces of said members in thermal and electrical contact with said heat exchangers are portions of concave spherical surfaces, cooperating with reciprocally shaped spherical surfaces of the base members of said heat exchangers.

3. A module according to claim 1, wherein the two external surfaces of said members in thermal and electrical contact with the heat exchangers are portions of concave cylindrical surfaces with the axes thereof extending either parallel or orthogonal, and being located in parallel planes cooperating with reciprocally shaped cylindrical surfaces of base members of the corresponding heat exchangers.

4. A module according to claim 1, wherein the arrangement of the 2x+1 thermoelements is of a circular geometry, said two members providing the electrical and thermal contact with heat exchangers also having a circular geometry.

5. A module according to claim 1 wherein the arrangement of the 2x+1 thermoelements is of rectangular geometry, the thermoelements being disposed in a chessboard pattern, the two members making the electrical and thermal contact with heat exchangers also having a rectangular geometry.

6. A module according to claim 1, wherein the arrangement of the 2x+1 thermoelements is a geometry wherein the said two members providing the electrical and thermal contact with a heat exchanger have a regular or non-polygonal shape.

7. A module according to claim 1, wherein the electrical insulation between the second type connectors and the said members is provided by a thin insulating layer disposed on the faces of said second type connectors facing the inner faces of said members, the thermal contact and mechanical connection being provided a further layer of an adhesive or a solder.

8. A module according to claim 1 wherein the electrical insulation between the connectors of the second type and the said members is provided by a thin insulating layer disposed on the faces of the second type connectors facing said members, said layer comprising an adhesive which provides the thermal contact with and the mechanical connection to said members.

9. A module according to claim 1, wherein one of the two external faces of said members in thermal and electrical contact with a heat exchanger is planar, the other face being a portion of convex or concave spherical surface of a base member of the other heat exchanger.

10. A module according to claim 1, wherein two external faces of said members in thermal and electrical contact with said heat exchangers are portions of convex spherical surfaces, cooperating with reciprocally shaped spherical surfaces of the base members of said heat exchangers.

11. A module acording to claim 1 wherein one of the two external faces of said members in thermal and electrical contact with the heat exchangers is planar, the other being a portion of convex or concave cylindrical surface, having an axis extending parallel to the plane of the planar surface, and co-operating with a reciprocally shaped cylindrical surface of the corresponding heat exchanger.

12. A module according to claim 1, wherein the two external surfaces of said members in thermal and electrical contact with the heat exchangers are portions of convex cylindrical surfaces with the axes thereof extending either parallel or orthogonal, and being located in parallel planes cooperating with reciprocally shaped cylindrical surfaces of base members of the corresponding heat exchangers.

13. A module according to claim 1 wherein the cross sectional areas provided for current flow are optimized for each of the two N and P-types of thermoelements and for the operating conditions, such optimization being carried out according to the thermoelectric characteristics of both N and P-types.

14. A module according to claim 13 wherein the thermoelectric characteristics of the two N and P-types of thermoelements are substantially equal and the cross sectional areas provided for current flow are equal for both N and P-types of thermoelements.

15. A thermoelectric device comprising stacks of electrically conducting heat exchangers and active thermoelectric units in thermal and electrical contact with said heat exchangers, said active units comprising both N-type modules and P-type modules and said modules each comprising an odd number (2x+1) of thermoelements, wherein (x) is a positive, non-zero integer; said thermoelements being connected electrically in series and thermally in parallel and being secured to corresponding electrical connectors, said electrical connectors being secured to inner face of two electrically conducting members which are in electrical and thermal contact, through the external faces thereof, with the heat exchangers and which act also as electrical terminals for module current flow, said electrical connectors which are secured to thermoelements being either two connectors of a first type secured, respectively, to a face of an inlet thermoelement and a face of an outlet thermoelement and in thermal and electrical contact with a respective one of said electrically conducting members so as to provide a module current inlet and outlet, or connectors of a second type, which are 2x in number, and are respectively secured in two groups of x connectors to the inner faces of said members in thermal contact therewith but electrically insulated therefrom by at least one insulating layer disposed on the surfaces of the second type connectors facing the inner faces of said members, said second type connectors serving to connect two by two the faces of the thermal elements which do not provide the current inlet and outlet so as to provide, in combination with the thermoelements which provide the current inlet and outlet and are secured to the two first type connectors, a preferential path for the current wherein the current is forced to flow through the entire plurality of thermoelements between the current inlet and outlet without flowing through said members, said module further including (x+1) thermoelements of a P or N-type and x thermoelements of the other P or N-type, and the current inlet and outlet being provided by two thermoelements of the type of the said x+1 thermoelements, so as to provide one or the other of two kinds of modules which are functionally equivalent ot single N and P-type thermoelements.

16. A module according to claim 15, wherein the arrangement of the 2x+1 thermoelements is of a circular geometry, said two electrically conducting members providing the electrical and thermal contact with heat exchangers also having a circular geometry.

17. A module according to claim 15 wherein the arrangement of the 2x+1 thermoelements is of rectangular geometry, the thermoelements being disposed in a chessboard pattern, the two members making the electrical and thermal contact with heat exchangers also having a rectangular geometry.

18. A module according to claim 15 wherein the arrangement of the 2x+1 thermoelements is a geometry wherein the said two members providing the electrical and thermal contact with a heat exchanger have a regular or non-polygonal shape.

19. A module according to claim 15, wherein the electrical insulation between the second type connectors and the said members is provided by a thin insulating layer disposed on the faces of said second type connectors facing the inner faces of said members, the thermal contact and mechanical connection being provided a further layer of an adhesive or a solder.

20. A module according to claim 15 wherein the electrical insulation between the connectors or the second type and the said members is provided by a thin insulating layer disposed on the faces of the second type connectors facing said members, said layer comprising an adhesive which provides the thermal contact with and the mechanical connection to said members.

21. A module according to claim 15 wherein at lesat one of the two external faces of said electrically conductive members in thermal and electrical contact with the heat exchangers having a non-planar shape cooperating with a reciprocally shaped base member of the corresponding heat exchanger.

* * * * *